United States Patent [19]
Yao et al.

[11] Patent Number: 6,133,613
[45] Date of Patent: Oct. 17, 2000

[54] ANTI-REFLECTION OXYNITRIDE FILM FOR TUNGSTEN-SILICIDE SUBSTRATES

[75] Inventors: Liang-Gi Yao, Taipei; John Chin-Hsiang Lin, Kaohsiung; Hua-Tai Lin, Tainan, all of Taiwan

[73] Assignee: Vanguard International Semiconductor Corporation, Hsinchu, Taiwan

[21] Appl. No.: 09/018,100

[22] Filed: Feb. 3, 1998

[51] Int. Cl.[7] .................................................. H01L 23/58
[52] U.S. Cl. ......................... 257/437; 257/639; 257/640
[58] Field of Search ................................... 257/437, 639, 257/640, 649, 768, 770

[56] References Cited

U.S. PATENT DOCUMENTS

| | | |
|---|---|---|
| 4,971,655 | 11/1990 | Stefano et al. . |
| 5,600,165 | 2/1997 | Tsukamoto et al. ................... 257/323 |
| 5,605,601 | 2/1997 | Kawasaki .............................. 156/643.1 |
| 5,639,689 | 6/1997 | Woo . |
| 5,924,000 | 7/1999 | Linliu .................................... 438/592 |

*Primary Examiner*—Roy Potter
*Attorney, Agent, or Firm*—Christensen O'Connor Johnson Kindness PLLC

[57] ABSTRACT

The present invention provides an anti-reflection film for lithographic application on tungsten-silicide containing substrate. In one embodiment of the present invention, a structure for improving lithography patterning in integrated circuit comprises a tungsten-silicide layer, a diaphanous layer located above the tungsten-silicide layer, an anti-reflection layer located above the diaphanous layer, and a photoresist layer located above the anti-reflection layer for patterning the integrated circuit pattern.

4 Claims, 3 Drawing Sheets

6,133,613

ANTI-REFLECTION OXYNITRIDE FILM FOR TUNGSTEN-SILICIDE SUBSTRATES

TECHNICAL FIELD OF THE INVENTION

The present invention relates to anti-reflection films for lithographic application, especially for tungsten-silicide containing substrate.

BACKGROUND OF THE INVENTION

Microcircuit fabrication requires that precisely controlled quantities of impurities be introduced into tiny regions of the silicon substrate. Subsequently, these regions must be interconnected to create components and VLSI circuits. The patterns that define such regions are created by a photolithographic process.

As semiconductor devices become more highly integrated, the line width of VLSI circuits typically becomes scaled down. The semiconductor industry's drive toward integrated circuits with ever decreasing geometries, coupled with its pervasive use of highly reflective materials, such as polysilicon, aluminum, and metal suicides, has led to increased photolithographic patterning problems. Unexpected reflections from these underlying materials, during the photoresist patterning step, result in the photoresist pattern being distorted.

This problem is further compounded when the photolithographic process is in the ultraviolet (UV) or deep ultraviolet (DUV) wavelength range. The patterns formed in the photoresist are easily compromised by the effects of uncontrolled reflections from the underlying materials due to the increased optical metallic nature of the underlying reflective materials at these wavelengths. Therefore, the fabrication of advanced integrated circuits with submicron geometries is limited.

SUMMARY OF THE INVENTION

It is an object of the present invention to provide anti-reflection films for lithographic application on tungsten-silicide containing substrate.

In one embodiment of the present invention, a structure for improving lithography patterning in integrated circuit comprises a tungsten-silicide layer, a diaphanous layer located above the tungsten-silicide layer(optional), an anti-reflection layer located above the diaphanous layer, and a photoresist layer located above the anti-reflection layer for patterning the integrated circuit pattern.

The method for forming a structure for improving lithography patterning in an integrated circuit comprises the steps of: providing a tungsten-silicide layer, providing a diaphanous layer over the tungsten-silicide containing substrate , forming an anti-reflection layer over the diaphanous layer, forming a photoresist layer on the anti-reflection layer, and then exposing a portion of the photoresist layer to electromagnetic radiation having a wavelength less than 440 nanometers.

DESCRIPTION OF THE PREFERRED EMBODIMENT

The present invention will be described in detail with reference to the drawings. The purpose of the present invention is to provide an anti-reflection film for lithographic application, especially for tungsten-silicide substrates. The precise optical characteristics of the anti-reflection film, preferably formed from oxynitride ($SiN_xO_y$), is dependent upon the recipe of the process for forming the oxynitride film. For example, the gas flow rate of $SiH_4$, $N_2O$, the deposition pressure, gas spacing (the distance between showerhead and susceptor), and the power of the plasma all affect the optical characteristics of the oxynitride film.

Figure 1:
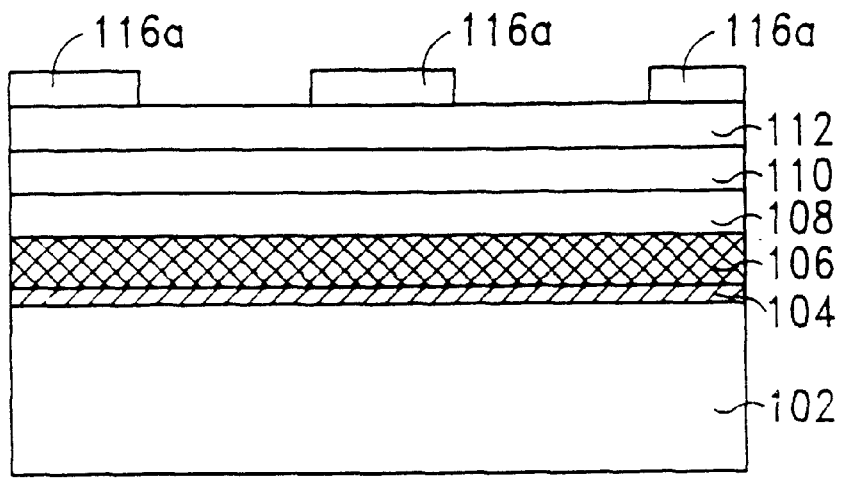
FIG. 1 is a cross section view of a first embodiment of the present invention.

FIG. 1 shows a cross section view of a first embodiment of the present invention. A polysilicon layer 104 is formed on a substrate 102. Next, a tungsten silicide layer 106 is formed on the polysilicon layer 104. A SiON layer 108 is then formed on the tungsten silicide layer 106 with a thickness of approximately 150 to 850 angstroms. Next, a LPTEOS layer 110 is deposited on the SiON layer 108 with a thickness of approximately 50 to 2000 angstroms. Finally, a SiN 112 layer is formed on the LPTEOS layer 110 with a thickness of approximately 150 to 3000 angstroms. The LPTEOS layer 110, and SiN layer 112 together act as a diaphanous layer 10.

An anti-reflection layer 108, preferably oxynitride ($SiN_xO_y$), is then formed on the $WSi_x$ layer 106. Different compositions forming the diaphanous layer 10 will affect the formation condition of the anti-reflection layer 108. In this preferred embodiment, the oxynitride ($SiN_xO_y$) is deposited by a plasma-enhanced CVD method. Using $SiH_4$ and $N_2O$ as reactants, the flow rate of $SiH_4$ is approximately 35 to 75 sccm, the flow rate of $N_2O$ is approximately 70 to 120 sccm, the gas spacing is 350 to 490 mils, and the deposition pressure is approximately 3 to 8 torr. The resultant oxynitride ($SiN_xO_y$) film has a refractive index in a range of 1.85 to 2.35, an extinction coefficient in a range of 0.45 to 0.85, and a thickness in a range of 150 to 850 angstroms. Aforementioned optical properties were measured at 248 nm wavelength.

A photoresist layer 116 is then formed on the SiN layer 112. After formation, the photoresist layer is then patterned using conventional photolithographic techniques and this results in the formation of the integrated circuit pattern 116a. Integrated circuit pattern 116a is preferably formed using electromagnetic radiation having an exposure wavelength of less than 440 nanometers.

Figure 2:
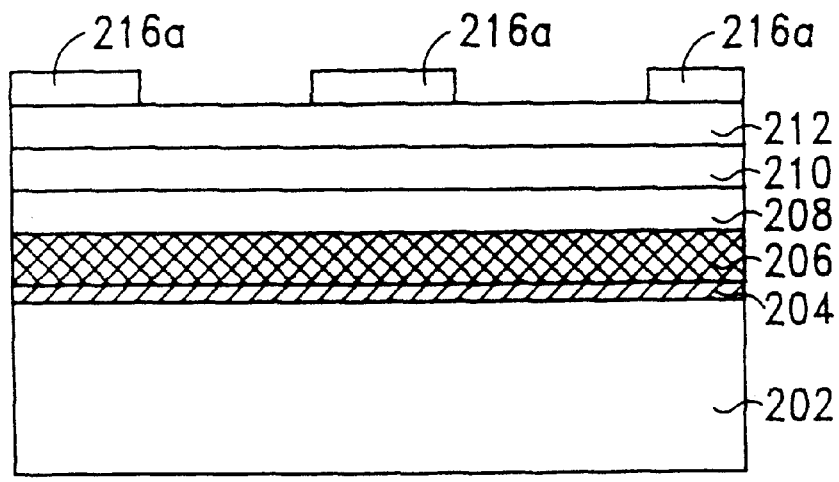
FIG. 2 is a cross section view of a second embodiment of the present invention.

FIG. 2 shows a cross section view of a second embodiment of the present invention. A polysilicon layer 204 is formed on a substrate 202. Next, a tungsten silicide layer 206 is formed on the polysilicon layer 204. Next, a LPTEOS layer 208 with a thickness of between 50 to 2000 angstroms is deposited on the tungsten silicide layer 206. A SiON layer 210 is then formed on the LPTEOS layer 208 with a thickness of approximately 150 to 850 angstroms. Finally, a SiN 212 layer is formed on the SiON layer 210 with a thickness of approximately 150 to 3000 angstroms. The LPTEOS layer 208, and SiN layer 212 together act as a diaphanous layer 20.

An anti-reflection layer 210, preferably oxynitride ($SiN_xO_y$), is then formed on the LPTEOS layer 208. Different compositions forming the diaphanous layer 20 will affect the formation condition of the anti-reflection layer 214. In this preferred embodiment, the oxynitride ($SiN_xO_y$) is deposited by a plasma-enhanced CVD method. Using $SiH_4$ and $N_2O$ as reactants, the flow rate of $SiH_4$ is approximately 35 to 75 sccm, the flow rate of $N_2O$ is approximately 70 to 120 sccm, the gas spacing is 350 to 490 mils, and the deposition pressure is approximately 3 to 8 torr. The resultant oxynitride ($SiN_xO_y$) film has a refractive index in a range of 1.85 to 2.35, an extinction coefficient in a range of 0.45 to 0.85, and a thickness in a range of 150 to 850 angstroms. Aforementioned optical properties were measured at 248 nm wavelength.

A photoresist layer 216 is then formed on the SiN layer 212. After formation, the photoresist layer is then patterned using conventional photolithographic techniques and this results in the formation of the integrated circuit pattern 216a. Integrated circuit pattern 216a is preferably formed using electromagnetic radiation having an exposure wavelength of less than 440 nanometers.

Figure 3:
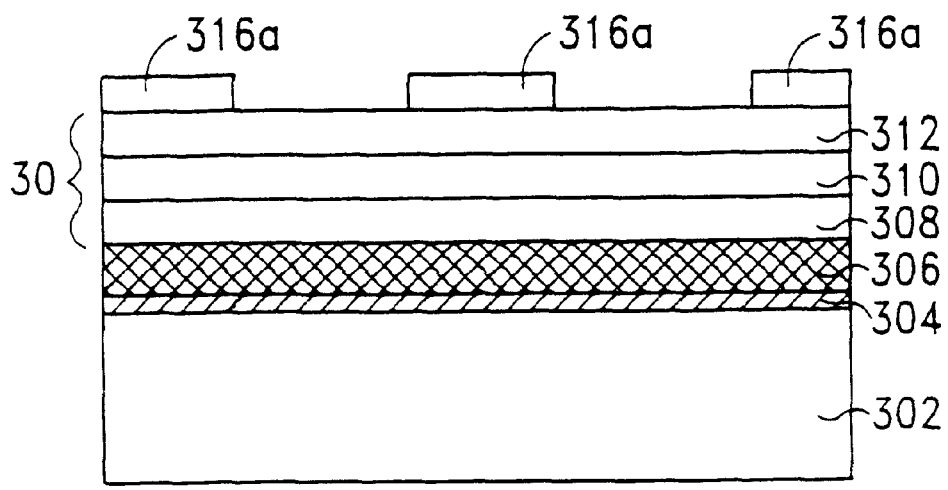
FIG. 3 is a cross section view of a third embodiment of the present invention.

FIG. 3 shows a cross section view of a third embodiment of the present invention. A polysilicon layer 304 is formed on a substrate 302. Next, a tungsten silicide layer 306 is formed on the polysilicon layer 304. Next, a LPTEOS layer 308 with a thickness of between 50 to 2000 angstroms is deposited on the tungsten silicide layer 306. A SiN 310 layer is formed on the LPTEOS layer 308 with a thickness of approximately 150 to 3000 angstroms. Finally, a SiON layer 312 is then formed on the SiN layer 310 with a thickness of approximately 150 to 850 angstroms. The SiON layer 312, the LPTEOS layer 308, and SiN layer 310 together act as a diaphanous layer 30.

An anti-reflection layer 312, preferably oxynitride ($SiN_xO_y$), is then formed on the SiON layer 312. Different compositions forming the diaphanous layer 30 will affect the formation condition of the anti-reflection layer 314. In this preferred embodiment, the oxynitride ($SiN_xO_y$) is deposited by a plasma-enhanced CVD method. Using $SiH_4$ and $N_2O$ as reactants, the flow rate of $SiH_4$ is approximately 35 to 75 sccm, the flow rate of $N_2O$ is approximately 70 to 120 sccm, the gas spacing is 350 to 490 mils, and the deposition pressure is approximately 3 to 8 torr. The resultant oxynitride ($SiN_xO_y$) film has a refractive index in a range of 1.85 to 2.35, an extinction coefficient in a range of 0.45 to 0.85, and a thickness in a range of 150 to 850 angstroms. Aforementioned optical properties were measured at 248 nm wavelength.

A photoresist layer 316 is then formed on the anti-reflection layer 314. After formation, the photoresist layer is then patterned using conventional photolithographic techniques and this results in the formation of the integrated circuit pattern 316a. Integrated circuit pattern 316a is preferably formed using electromagnetic radiation having an exposure wavelength of less than 440 nanometers.

Figure 4:
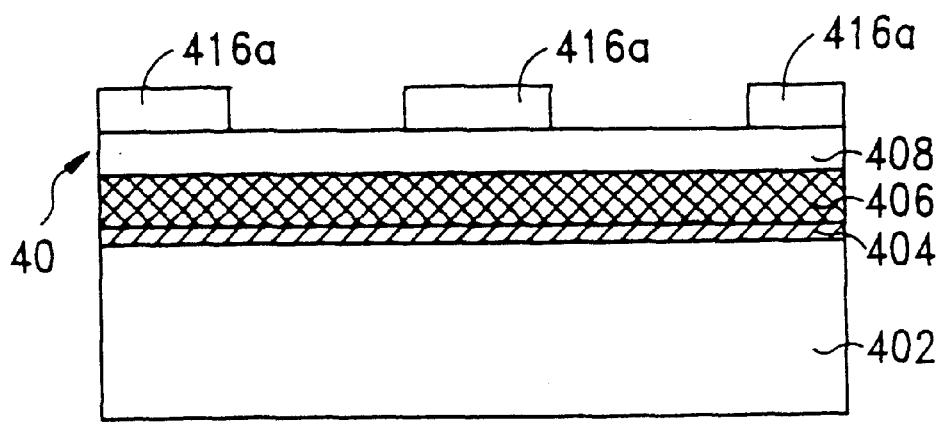
FIG. 4 is a cross section view of a fourth embodiment of the present invention.

FIG. 4 shows the cross section view of a fourth embodiment of the present invention. A polysilicon layer 404 is formed on a substrate 402. Next, a tungsten silicide layer 406 is formed on the polysilicon layer 404. A SiON layer 408 is then formed on the tungsten silicide layer 406 with a thickness of approximately 150 to 850 angstroms.

An anti-reflection layer 414, preferably oxynitride ($SiN_xO_y$), is then formed on the SiON layer 408. In this preferred embodiment, the oxynitride ($SiN_xO_y$) is deposited by a plasma-enhanced CVD method. Using $SiH_4$ and $N_2O$ as reactants, the flow rate of $SiH_4$ is approximately 35 to 75 sccm, the flow rate of $N_2O$ is approximately 70 to 120 sccm, the gas spacing is 350 to 490 mils, and the deposition pressure is approximately 3 to 8 torr. The resultant oxynitride ($SiN_xO_y$) film has a refractive index in a range of 1.85 to 2.35, an extinction coefficient in a range of 0.45 to 0.85, and a thickness in a range of 150 to 850 angstroms. Aforementioned optical properties were measured at 248 nm wavelength.

A photoresist layer 416 is then formed on the anti-reflection layer 414. After formation, the photoresist layer is then patterned using conventional photolithographic techniques and this results in the formation of the integrated circuit pattern 416a. Integrated circuit pattern 116a is preferably formed using electromagnetic radiation having an exposure wavelength of less than 440 nanometers.

Figure 5:
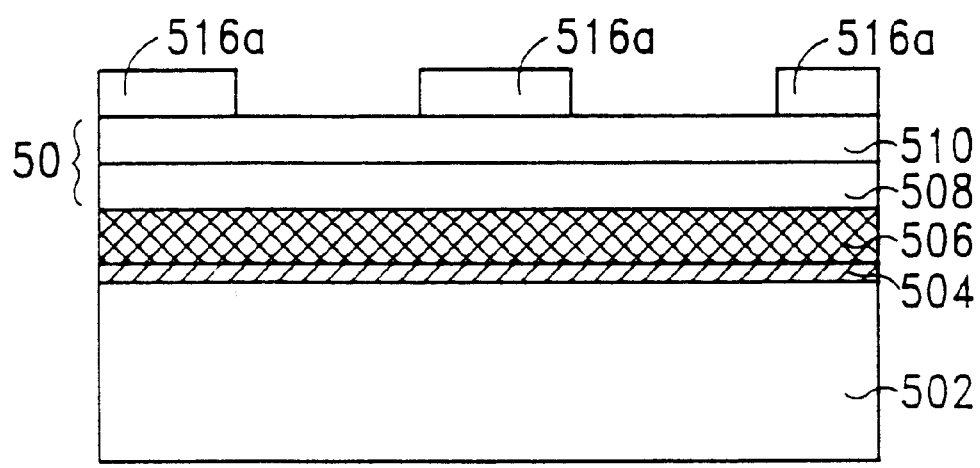
FIG. 5 is a cross section view of a fifth embodiment of the present invention.

FIG. 5 shows the cross section view of a fifth embodiment of the present invention. A polysilicon layer 504 is formed on a substrate 502. Next, a tungsten silicide layer 506 is formed on the polysilicon layer 504. A SiON layer 508 is then formed on the tungsten silicide layer 506 with a thickness of approximately 150 to 850 angstroms. Next, a LPTEOS layer 510 or SiN layer is deposited on the SiON layer 508 with a thickness of approximately 100 to 2000 angstroms or either SiN with a thickness range of 100 to 2000 angstroms. The LPTEOS layer or SiN layer 510 act as a diaphanous layer 50.

An anti-reflection layer 508, preferably oxynitride ($SiN_xO_y$), is then formed on the $WSi_x$ layer 506. In this preferred embodiment, the oxynitride ($SiN_xO_y$) is deposited by a plasma-enhanced CVD method. Using $SiH_4$ and $N_2O$ as reactants, the flow rate of $SiH_4$ is approximately 35 to 75 sccm, the flow rate of $N_2O$ is approximately 70 to 120 sccm, the gas spacing is 350 to 490 mils, and the deposition pressure is approximately 3 to 8 torr. The resultant oxynitride ($SiN_xO_y$) film has a refractive index in a range of 1.85 to 2.35, an extinction coefficient in a range of 0.45 to 0.85, and a thickness in a range of 150 to 850 angstroms. Aforementioned optical properties were measured at 248 nm wavelength.

A photoresist layer 516 is then formed on the LPTEOS or SiN layer 510. After formation, the photoresist layer is then patterned using conventional photolithographic techniques and this results in the formation of the integrated circuit pattern 516a. Integrated circuit pattern 516a is preferably formed using electromagnetic radiation having an exposure wavelength of less than 440 nanometers.

The preferred range of refractive index n, extinction coefficient k, and thickness of the oxynitride layer can be determined by controlling the ratio of the gas flow rate of $SiH_4$ and $N_2O$, the power of plasma, the gas spacing, and the process pressure in the step of forming the oxynitride layer to improve the photolithography process performance.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A structure for improving lithography patterning in an integrated circuit, the structure comprising:

a substrate;

a polysilicon layer formed on said substrate;

a tungsten-silicide layer formed on said polysilicon layer; and a $SiO_xN_y$ layer formed on said tungsten-silicide layer, the refractive index of said $SiO_xN_y$ layer being in a range of approximately 1.85 to 2.35 and the extinction coefficient of said $SiO_xN_y$ layer being in a range of approximately 0.45 to 0.85, said refractive index and said extinction coefficient measured at approximately 248 nm wavelength.

2. The structure of claim 1, further comprising an LPTEOS layer formed on said $SiO_xN_y$ layer.

3. The structure of claim 2, further comprising a SiN layer formed on said LPTEOS layer.

4. A structure for improving lithography patterning in an integrated circuit, the structure comprising:

a substrate;

a polysilicon layer formed on said substrate;

a tungsten-silicide layer formed on said polysilicon layer;

an LPTEOS layer formed on said tungsten-silicide layer;

a SiN layer formed on said LPTEOS layer; and a $SiO_xN_y$ layer formed on said SiN layer, said $SiO_xN_y$ layer having a thickness in a range of approximately 150 to 850 angstroms, the refractive index of said $SiO_xN_y$ layer being in a range of approximately 1.85 to 2.35 and the extinction coefficient of said $SiO_xN_y$ being in a range of approximately 0.45 to 0.85, said refractive index and said extinction coefficient measured at approximately 248 nm wavelength.

* * * * *

UNITED STATES PATENT AND TRADEMARK OFFICE
CERTIFICATE OF CORRECTION

PATENT NO. : 6,133,613
DATED : October 17, 2000
INVENTOR(S) : L.-G. Yao et al.

It is certified that error appears in the above-identified patent and that said Letters Patent is hereby corrected as shown below:

COLUMN        LINE

[57]              Abstract           "cir-
Pg. 1, col. 2     4-5 of text        cuit" should read --cir-
                                     cuits--

6                 8                  "$SiO_xN_y$ being" should read --$SiO_xN_y$ layer being--
(Claim 4,         line 12)

Signed and Sealed this

First Day of May, 2001

Attest:

NICHOLAS P. GODICI

Attesting Officer        Acting Director of the United States Patent and Trademark Office